United States Patent [19]

Ambros et al.

[11] 4,281,038

[45] Jul. 28, 1981

[54] NON-CONDUCTIVE SUBSTRATE FOR A PRINTED CIRCUIT AND METHOD OF MANUFACTURE

[75] Inventors: Peter Ambros, Hohenroth; Hermann Geyer, Oberbach, both of Fed. Rep. of Germany

[73] Assignee: Preh, Elektrofeinmechanische Werke, Jakob Preh Nachf GmbH & Co., Neustadt, Fed. Rep. of Germany

[21] Appl. No.: 102,154

[22] Filed: Dec. 10, 1979

[30] Foreign Application Priority Data

Dec. 16, 1978 [DE] Fed. Rep. of Germany ....... 2854385

[51] Int. Cl.$^3$ ................................................ C08K 9/06
[52] U.S. Cl. .................................. 428/131; 260/37 M; 260/42.15; 428/156; 428/209; 428/327; 428/328; 428/331; 428/404; 428/405; 428/407; 428/901
[58] Field of Search ........................... 260/37 M, 42.15; 428/156, 209, 327, 328, 331, 404, 405, 901, 131, 137, 407

[56] References Cited

U.S. PATENT DOCUMENTS

| | | | |
|---|---|---|---|
| 2,739,881 | 3/1956 | Kepple | 41/42 |
| 3,031,344 | 4/1962 | Sher | 117/212 |
| 3,672,986 | 6/1972 | Schneble | 117/212 |
| 3,799,802 | 3/1974 | Schneble | 117/212 |
| 3,910,852 | 10/1975 | Lederman | 260/37 M |

FOREIGN PATENT DOCUMENTS

| | | |
|---|---|---|
| 1615962 | 8/1970 | Fed. Rep. of Germany . |
| 1665374 | 9/1971 | Fed. Rep. of Germany . |
| 2027469 | 12/1971 | Fed. Rep. of Germany . |
| 2216499 | 9/1973 | Fed. Rep. of Germany . |
| 2442016 | 3/1980 | Fed. Rep. of Germany . |
| 1164591 | 9/1969 | United Kingdom . |
| 1427579 | 3/1976 | United Kingdom . |

*Primary Examiner*—Marion McCamish
*Attorney, Agent, or Firm*—Kane, Dalsimer, Kane, Sullivan and Kurucz

[57] ABSTRACT

The disclosure is of a substrate or supporting board for supporting printed circuits and the method of its manufacture. The boards of the invention are preferably made of a high-temperature resistant thermoplastic, sensitized to receive a printed circuit element by the dispersion of coated iron or copper particles in the thermoplastic matrix. The coating is a bonding assistant.

13 Claims, 2 Drawing Figures

U.S. Patent    Jul. 28, 1981    4,281,038
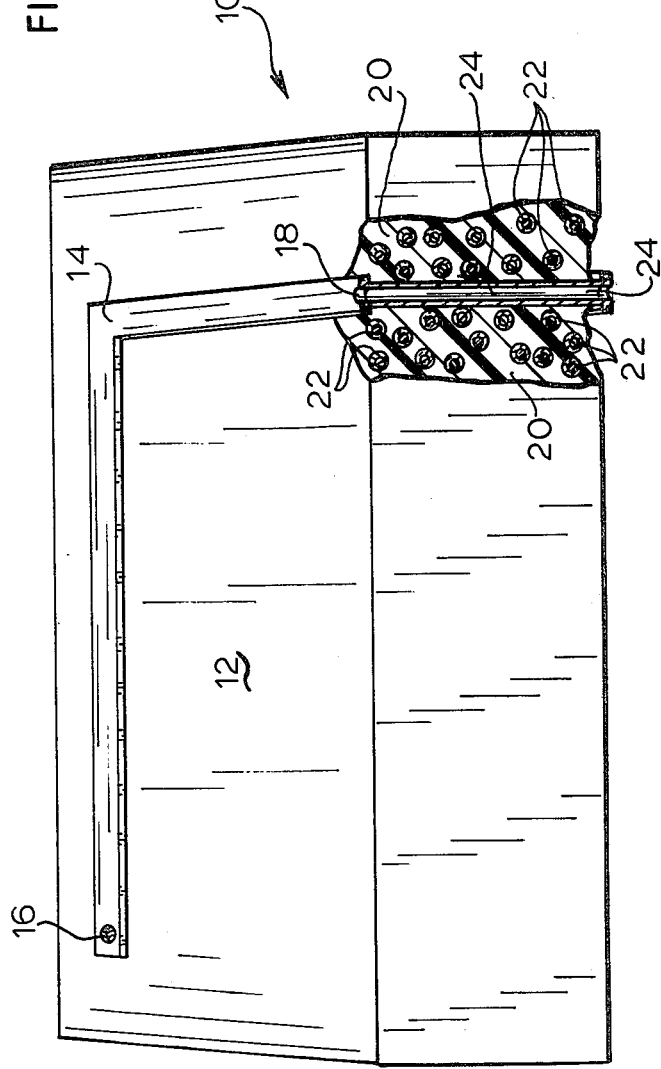
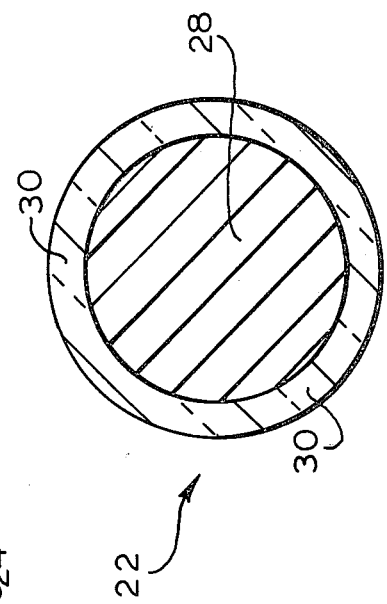

NON-CONDUCTIVE SUBSTRATE FOR A PRINTED CIRCUIT AND METHOD OF MANUFACTURE

BACKGROUND OF THE INVENTION

1. Field of the Invention

The invention relates to non-conductive substrates for supporting printed circuits, methods of manufacturing such substrates and printed circuit units made therefrom.

2. Brief Description of the Prior Art

Prior to the present invention, numerous methods were available for the manufacture of printed circuit units. One widely used method is the so-called "subtractive method" wherein printed circuit substrates (boards) are made with circuit holes in or through the board. The board is a non-conductive base and may bear a conductive circuit on one or more surfaces of the non-conductive base, connected through the circuit hole. The method of making such units comprises adhering an electrically conductive metal foil to the non-conductive base, applying a photo-resist coating to the foil, curing the coating in a predetermined pattern, washing away the uncured coating and etching the exposed portion of the metal foil away. Left are the portions of foil in a desired circuit pattern corresponding to the predetermined pattern. The walls of the circuit hole joining patterns on different surfaces receive a deposit of palladium crystals, which serve as a nucleating site on which a conductive connection is made from one surface to the other by a copper plating. This thin copper plating must be strengthened galvanically with very ductile copper coatings. In this manner, the copper is deposited on the circuit hole walls and also on the conductor circuit. As mentioned above, in the etching process the conductor paths or circuit is covered with an etch resistant material. During etching, the uncovered conductor faces are etched off with etch solvents. The disadvantage of this so-called "subtractive method" is that it is time consuming due to the numerous operating steps. Furthermore, a large quantity of copper is accumulated in the etch solvents, and cannot be used further or must be subjected to a rather expensive recovery process. Furthermore, insufficient etching may occur.

In the so-called "additive method" an adhesive is applied to the non-conductive circuit board and then subjected to a chemical etching treatment so as to provide bonding between a subsequently applied copper layer and the non-conductive board. Subsequently, the non-conductive board is sensitized and then copper plated in a known manner. Thereafter, also in a known manner, a negative pattern is made on the copper plate, employing a screen printing or photo printing process. In a subsequent galvanic copper plating the desired conductor path thickness may be obtained. The subsequent operating steps correspond to the ones in the above-described subtractive method. For obtaining a better bonding of the conductive circuit to the base, it is often necessary to first roughen the non-conductive board's surface prior to its receiving the adhesive. It will be appreciated that the "additive method" has many of the same disadvantages associated with the "subtractive method".

It is within the state of the art to apply metal patterns or conductor paths on a non-conductive substrate by means of an electroless metal deposition. For this purpose the non-conductive substrate surface must be sensitized or activated. A general method for activation comprises bringing the substrate into contact with two separate solutions. First, the substrate is brought into contact with an aqueous acid solution of a reducing agent followed by a rinsing with water. The substrate is then treated with a second solution of an active metal salt in dilute hydrochloric acid. The reducing agent, which is absorbed by the substrate surface in the first step, reduces the ions of the active metal on the substrate surface, whereby sensitized centers are generated on which the chemically deposited metal adheres. This method is disadvantageous in that the metal deposits, for example copper coatings do not bond sufficiently to the non-conductive substrate surface. A further disadvantage is that, in a two stage activation of the substrate, after the activation and before carrying out further treatment steps, the non-conductive substrate must be transferred to other supports so as to eliminate a contamination of the activator solution and a rapid decay of the metal deposition bath. In addition, it is very hard to cover the circuit holes with a deposit of metal.

A method is also known for making a printed circuit board wherein electrically conductive faces and conductor paths are applied to a non-conductive substrate layer by electroless metallization. In this case the electrically non-conductive substrate may be a phenolic resin or an epoxide resin mass which contains an inorganic filler material in addition to a copper oxide. The filler material may be treated with acids or lye. The filler materials may be metal oxides and/or silicon dioxide (which can be obtained by wet precipitation as well as in a pyrogenic process). Furthermore, synthetic alkali and/or earth alkali and/or aluminum silicate may be used. The filler material is added to the electrically non-conductive base material in quantities of preferably 20 to 40% by weight. After making pressed plates of the filled, non-conductive materials, the surface of the plates are degreased in a conventional alkali degreasing bath, and subsequently the pressed plate is treated with a warm sodium hydroxide solution. A treatment with sulfuric acid is then carried out so as to partly transform the copper oxide on the surface of the pressed plate into copper. A thin copper plating on the plate is then carried out in a plating bath. The desired faces on the prepared plates are then galvanically strengthened in that the remainder of the faces are first covered with a protective lacquer. The protective lacquer is then removed in a desired pattern and the thin, nonstrengthened copper layer is etched off. While the mixture of phenolic resin mass and copper oxide has a low metal bonding characteristic, the adherence values for the mixture of a phenolic resin press mass, copper oxide and a filler material are higher. However, this method can only be used for an electroless metallization on the surface of the plate, but not on the inner walls of the circuit holes. Furthermore, the use of thermoplastic materials as the non-conductive base is generally disadvantageous since, although conductor paths may be mounted thereon, no resistor layers (which have to be hardened at higher temperatures) can be affixed. Furthermore, the processing of thermoplastic materials in a press molding process is relatively cumbersome and therefore expensive.

A method for making a plastic, electrically nonconductive element is known onto which a metal layer may be mounted. The plastic element comprises an epoxy resin or a polyester resin. While in a uncured state, a finely dispersed catalyst salt is added to the resin. The catalyst salts may be the salts of metals of group VIII or group XII of the Periodic Table. The catalyst salt, which is generally found to be in higher concentration on the surface of the plastic element rather than in the inner layers, is activated during the curing or hardening of the plastic material. Filler material, in powdered form, consisting of tartaric acid, citric acid or acetic acid are also admixed in the uncured plastic material. The surface of the plastic material is then removed after a partial hardening, mechanically or chemically, until the powder granules of metal salts are partially free and are removable with a solvent. The metal salt powder granules, which are reduced to metal subsequently, initiate a further chemical metal reduction during the autocatalytic metal deposition. The disadvantages of this method is that a continuous, non-controllable removal of the metal salts takes place in the metallization bath. Obviously, this method is suitable for metallization of a plastic surface but not for the walls of any circuit holes passing from one surface to another surface in the non-conductive base.

The present invention provides a non-conductive board for supporting a printed circuit and a method of its manufacture which removes many of the aforementioned problems and disadvantages of the prior art. The circuit board of the invention comprises an easily processed support material with conductor paths having an increased adherence to the support. The printed circuit board of the invention is also advantageous for mounting resistor layers.

SUMMARY OF THE INVENTION

The invention comprises an electrically non-conductive base for a printed circuit, which comprises;
  a high temperature resistant thermoplastic having dispersed therein a plurality of discrete particles of a material selected from the group consisting of iron, copper, compounds of iron, compounds of copper and mixtures thereof;
  said particles bearing a coating of a bonding assistant.

The invention also comprises a method of making the base of the invention and printed circuit units made with the base component of the invention.

An advantage of the method of the invention resides in the simultaneous making of the circuit holes joining conductive pathways on opposite surfaces of the non-conductive board. The ordinarily required additional operating steps for making through contact apertures and the metallizing of the same are eliminated. In view of the fact that the sensitizing catalyst particles are homogenously dispersed in the non-conductive support material, all free activated surfaces and in particular the circuit hole aperture walls are readily metallized during the subsequent metallization process.

Further advantages with respect to the known state of the art is in the simple use of the third dimension, i.e., the ability by injection molding to provide on the flat nonconductive board, protrusions from the flat surface. These protrusions function as assembly aids for construction elements or other mounting means. A further advantage when using high temperature resistant thermoplastic materials as the non-conductive base is that this material has a low water absorbability. This is very important during metallization in chemical baths.

Due to the firm anchoring of the catalyst particles in the support material, the adherence of the metal conductor paths to the support exceeds that obtained previously by the known electroless techniques. Adhesion values of 150 N/12 mm$^2$ and more may be obtained.

BRIEF DESCRIPTION OF THE DRAWINGS

FIG. 1 is a view in perspective, partially cut-away, of an embodiment printed circuit and supporting board of the invention.

FIG. 2 is an enlarged cross-sectional view of a metal particle component of the board shown in FIG. 1.

DETAILED DESCRIPTION OF THE PREFERRED EMBODIMENTS OF THE INVENTION

According to the method of the invention, non-conductive substrates or boards for use as the support element of the circuit board units of the invention, are fabricated from a dielectric composition. Preferably a high temperature resistant, thermoplastic resin material is used as this support material. Representative of such resins are polyphenyloxide, polyphenylsulfide, polyimide, polyethersulfone and the like. Catalyst particles are homogenously admixed in the thermoplastic material at a ratio of 20 to 80%, preferably 40 to 70% by weight of the resin. These catalyst particles are advantageously particles of copper, iron and/or compounds of copper and iron. The particles are partly or completely encapsulated with a bonding assistant material. Such a material may be a silicone resin, an organic silane or a silane ester. In the case of using a silicone resin this resin may be admixed with the catalyst particles in a ratio of 0.5 to 10%, preferably 0.5 to 20% by weight of the support material/catalyst particle mixture.

The non-conductive substrate is made as follows. First, the catalyst particles are dispersed in a volatile carrier such as toluene or the like. The dispersion is then introduced into a rotational evaporator. The bonding assistant is then added and the volatile carrier is evaporated from the rotational evaporator by heating under a vacuum. In this manner the catalyst particles are partly or completely encapsulated by the bonding assistant. Thereafter, the encapsulated catalyst particles are admixed in the resin support material by making a dry blend. In order to obtain a homogenous distribution, the mixing may be carried out in an extrusion process. The final mixture is then discharged in the form of a granulate. The granulate may be processed further in an injection molding, a press molding or an extrusion molding process to obtain a plate or substrate board of the non-conductive material. The through-contact apertures or circuit holes are simultaneously made by these methods. Furthermore, and if so desired, unitary protrusions may be molded on the flat surfaces of the plate or board. These protrusions may act as supports (pedestals), side walls, snap hooks, assembly aids for construction elements etc., in the later assembly of the printed circuit board in its use. The non-conductive board may be used to support a printed circuit with circuit holes connecting different circuits on different surfaces of the board.

The finished, non-conductive substrate board for supporting a printed circuit may be further processed to receive on one or more surfaces a printed circuit. The fixing of a printed circuit on the non-conductive base may be carried out employing any one of the aforementioned prior art techniques. Preferably, the method chosen will be one of:
  (a) The metallization of the non-conductive board over its total face with a subsequent etching of the faces which are not covered with an etch resistant agent and whereby the etching is carried out in known manner.

(b) Selective metallization of the non-conductive board faces which are not covered with a masking lacquer during the screen printing process.

(c) Selective metallization of the free non-conductive board faces which are obtained by photo-resist technique using actinic light and a photo resistor mask.

The method in accordance with (c) above is particularly advantageous when protrusions are formed on the surface of the non-conductive board, because the conductor paths can then be guided over the protrusions.

Printed metallic circuits so affixed to the non-conductive bases of the invention are uniform and highly adherent. So too are the metallized portions of the circuit holes, which may be deposited by the conventional techniques.

Referring now to the drawings, one may see in FIG. 1 a view-in-perspective of an embodiment printed circuit unit 10 of the invention, partially cut-away. The unit 10 comprises a non-conductive substrate board 12 supporting a metallic printed conductive circuit 14. The circuit 14 includes circuit holes 16, 18 through board 12. As shown, the circuit hole 18 joins circuits on opposite sides of the board 12. The board 12 is made up of a thermoplastic matrix 20 of non-conductive material as previously described, having dispersed therein particles 22. The presence of these particles has assured a uniform metallization of the inner walls 24 of circuit hole 18 as previously described. The particles 22 consist of a metal core 28 (see FIG. 2, an enlarged, cross-sectional view of particle 22) encapsulated in a coating of a bonding assistant 30. The metal particle 28 and assistant 30 were described above.

Catalysts as used:
Copper compounds:
 copper (I)-oxide, copper sulfate,
 copper (I)-chloride, copper (I)-hydride,
 copper alloys with nickel and/or aluminium
Iron compounds:
 different iron alloys with nickel
Particle size of catalyst:
 up to 50 μm
 preferably 2 to 10 μm
Bonding assistant:
 silicone resin solution RE
 silan GF 91 of the firm Wacker Example: 500 g PPO (Polyphenylenoxide) are placed into a 2 l rotational evaporator together with 125 g of copper (I)-oxide and 1 l acetone and, at a speed of 130 min$^{-1}$, 25 g of silicone resin solution RE is added. After a mixing period of 15 minutes, the volatile carrier is evaporated by heating. Subsequently, the powder mixture is extruded under vacuum by means of an extruder, and is then granulated by a water bath by means of a granulating device. Prior to the injection molding process, the granulate is dried for 1½ hours at 120° C. and is cast to a molded part by means of an injection molding machine.

What is claimed:
1. An electrically non-conductive base for a printed circuit, which comprises:
 a high temperature resistant thermoplastic selected from the group consisting of polyphenyloxide, polyphenylsulfide, polyimide and polyethersulfone having dispersed therein a plurality of discrete particles of a material selected from the group consisting of iron, copper, compounds of iron, compounds of copper and mixtures thereof;
 said particles bearing a coating of a bonding assistant selected from the group consisting of a silicone resin, an organic silane and a silane ester.

2. The base of claim 1 wherein said particles are present in a proportion of 20 to 80 percent by weight of the thermoplastic.

3. The base of claim 1 wherein said particles are present in a proportion of 40 to 70 percent by weight of the thermoplastic.

4. The base of claim 1 wherein the bonding assistant is a silicone resin which is admixed in the mixture of the support material/catalyst in a proportion of 0.5 to 10% by weight of the mixture.

5. The base of claim 1 having unitary protrusions in the form of pedestals, side walls, snap hooks and assembly aids for construction elements on its surface.

6. The base of claim 1 having a printed circuit on at least one surface.

7. A method of making a non-conductive base for a printed circuit, which comprises;
 at least partially encapsulating particles of a material selected from the group consisting of copper, iron, copper compounds and iron compounds in a bonding assistant selected from the group consisting of a silicone resin, an organic silane and a silane ester;
 admixing the encapsulated particles in a thermoplastic resin selected from the group consisting of polyphenyloxide, polyphenylsulfide, polyimide and polyethersulfone; and
 forming the base in a desired shape.

8. The method of claim 7 wherein encapsulating is carried out by
 dispersing the particles in a volatile carrier;
 mixing the dispersion with the bonding assistant; and
 evaporating the carrier.

9. The method of claim 8 wherein the carrier is toluene.

10. The method of claim 8 wherein circuit holes are made in the forming step.

11. The method of claim 8 wherein mixing is in a dry blend which is granulated.

12. The method of claim 11 wherein granulation is by extrusion of the dry blend.

13. The method of claim 8 wherein forming is by one of injection molding process, press molding method or extrusion molding.

* * * * *